United States Patent
Mazerolle et al.

(10) Patent No.: US 9,919,423 B2
(45) Date of Patent: Mar. 20, 2018

(54) POSITIONING DEVICE

(71) Applicant: ETEL S.A., Môtiers (CH)

(72) Inventors: Hélène Mazerolle, Mauborget (CH);
Jean-Marc Vaucher, Couvet (CH);
Marc Kunze, Chavornay (CH);
Laurent Heiniger, Fontainemelon (CH)

(73) Assignee: ETEL S.A., Môtiers (CH)

( * ) Notice: Subject to any disclaimer, the term of this patent is extended or adjusted under 35 U.S.C. 154(b) by 74 days.

(21) Appl. No.: 15/106,622

(22) PCT Filed: Sep. 8, 2014

(86) PCT No.: PCT/EP2014/069032
§ 371 (c)(1),
(2) Date: Jun. 20, 2016

(87) PCT Pub. No.: WO2015/090652
PCT Pub. Date: Jun. 25, 2015

(65) Prior Publication Data
US 2017/0001310 A1    Jan. 5, 2017

(30) Foreign Application Priority Data
Dec. 18, 2013  (DE) .................. 10 2013 226 448

(51) Int. Cl.
*G05B 15/00*  (2006.01)
*B25J 9/16*  (2006.01)
(Continued)

(52) U.S. Cl.
CPC ............ *B25J 9/1633* (2013.01); *B23Q 1/012* (2013.01); *B25J 9/1687* (2013.01); *H05K 3/341* (2013.01);
(Continued)

(58) Field of Classification Search
CPC ... B25J 9/1633; B25J 9/1687; H05K 13/0465; H05K 3/341; H05K 13/08;
(Continued)

(56) References Cited

U.S. PATENT DOCUMENTS 3,637,032 A * 1/1972 Jeter .................... E21B 7/06
                                                    175/73
5,402,684 A  4/1995 Engeler et al.
(Continued)

FOREIGN PATENT DOCUMENTS

DE         44 25 924        1/1996
DE     10 2009 008 900      11/2009
(Continued)

OTHER PUBLICATIONS

International Search Report issued in PCT/EP2014/069032, dated Dec. 19, 2014.
(Continued)

*Primary Examiner* — Ian Jen
(74) *Attorney, Agent, or Firm* — Andrews Kurth Kenyon LLP

(57) ABSTRACT

A positioning device is adapted for positioning a tool at a setpoint position on a flat substrate in an X-Y plane, the tool exerting a process force in its axial direction perpendicularly onto the substrate. The tool includes a multicomponent force sensor to measure unwanted process-force components in the lateral direction. The setpoint position of the tool is correctable by the positioning device such that the lateral process-force components are minimized.

10 Claims, 2 Drawing Sheets

(51) Int. Cl.
*B23Q 1/01* (2006.01)
*H05K 3/34* (2006.01)
*H05K 13/04* (2006.01)
*H05K 13/08* (2006.01)

(52) U.S. Cl.
CPC ......... *H05K 13/0465* (2013.01); *H05K 13/08* (2013.01); *G05B 2219/37225* (2013.01); *G05B 2219/39325* (2013.01); *G05B 2219/40293* (2013.01); *G05B 2219/45029* (2013.01); *G05B 2219/49191* (2013.01); *G05B 2219/50355* (2013.01); *H05K 2203/04* (2013.01)

(58) Field of Classification Search
CPC ............... H05K 2203/04; B23Q 1/012; G05B 2219/50355; G05B 2219/45029; G05B 2219/49191; G05B 2219/40293; G05B 2219/39325; G05B 2219/372
See application file for complete search history.

(56) References Cited

U.S. PATENT DOCUMENTS

| | | | |
|---|---|---|---|
| 8,040,099 B2 | 10/2011 | Coleman et al. | |
| 8,369,983 B2 | 2/2013 | Sato et al. | |
| 2004/0128096 A1* | 7/2004 | Luo | G05D 1/0825 702/96 |
| 2009/0133992 A1* | 5/2009 | Enenkel | B65H 29/12 198/807 |
| 2010/0252257 A1* | 10/2010 | Cronley | E21B 41/0035 166/255.1 |
| 2011/0297293 A1* | 12/2011 | Carson | B29C 49/2408 156/64 |
| 2014/0041182 A1* | 2/2014 | Katok | B23P 11/00 29/402.08 |
| 2017/0001310 A1* | 1/2017 | Mazerolle | B23Q 1/012 |

FOREIGN PATENT DOCUMENTS

| | | |
|---|---|---|
| EP | 0 594 534 | 4/1994 |
| EP | 2 002 945 | 12/2008 |
| EP | 2 052 810 | 12/2010 |
| EP | 2 066 996 | 8/2012 |
| JP | S61-28835 | 2/1986 |
| JP | 2002-289647 | 10/2002 |
| WO | 2009/053323 | 4/2009 |

OTHER PUBLICATIONS

Dégoulange, et al., "Determination of a Force control Law for an Industrial Robot in Contact with a Rigid Environment", Proceedings of the International Conference on Systems, Man and Cybernetics, Oct. 17-20, 1993.

Lee, et al., "Design and control of a spherical air-bearing system for multi-d.o.f. ball-joint-like actuators", Mechatronics, Pergamon Press, Oxford, GB, vol. 13, No. 2, Mar. 1, 2002.

* cited by examiner

POSITIONING DEVICE

FIELD OF THE INVENTION

The present invention relates to a positioning device for processing a workpiece or for placing components in one plane. For example, such positioning devices are used to position electronic components on a printed circuit board, or perhaps to machine flat workpieces using a tool.

BACKGROUND INFORMATION

European Patent No. 2 066 996 describes a positioning device in a gantry-type construction in which a cross bar is movably supported between two parallel linear guides, a functional element being movably supported on the cross bar with the aid of a further linear guide, so that this functional element is able to be positioned freely in one plane between the two parallel linear guides. For example, a gripper of an automatic pick-and-place machine, a laser of a laser machining center, or perhaps a probe system of a coordinate measuring machine are possible as the functional element. European Patent No. 2 066 996 deals primarily with the most precise position measurement possible in connection with such positioning devices, since precise positioning of the functional element is often very important.

German Published Patent Application No. 10 2009 008 900 describes such positioning devices in gantry-type construction, as well. For various reasons, they are not easy to control from the standpoint of automatic control engineering. Therefore, a device is described for controlling a positioning device automatically, which permits particularly precise positioning.

If the functional element, which is guided on the cross bar and positioned above the workpiece, must exert considerable force on the workpiece, this may lead to deformation of the components of the positioning device. Because of the great leverage which comes about due to the gantry-type construction, small deformations may already lead to a considerable displacement of the point of application of the tool on the workpiece, which is unacceptable for practical applications with a high requirement for positioning accuracy. An example for such an application is thermocompression bonding, in which electronic components are joined to a printed circuit board by pressure and temperature. Forces up to 500 N may be necessary for this purpose. On the other hand, positioning accuracies in the range of one micrometer and less required in such and comparable applications are not uncommon.

Such great forces are especially problematic when the substrate on which electronic components is placed is not aligned very precisely horizontally, so that the vertical process force is not exerted exactly perpendicularly onto the substrate. The lateral forces thereby resulting are already no longer acceptable in the case of small tiltings of the substrate. In addition, the electronic component to be placed must also be parallel to the printed-circuit-board substrate, which is no longer ensured if the substrate is tilted.

Multicomponent force sensors for measuring axial and lateral forces that may appear in connection with a tool with axial preferential direction are described, for example, in European Patent No. 2 052 810, European Patent No. 0 594 534, and Japanese Patent Application Publication No. S61-28835.

SUMMARY

Example embodiments of the present invention provide a positioning device which, in spite of tilting of a substrate upon which a process force is to be exerted, permits exact positioning of a functional element on the substrate.

According to an example embodiment of the present invention, a positioning device is adapted to position a tool at a setpoint position on a flat substrate in an X-Y plane, the tool exerting a process force in its axial direction perpendicularly onto the substrate. The tool is equipped with a multicomponent force sensor to measure unwanted process-force components in the lateral direction. The setpoint position of the tool is correctable by the positioning device such that the lateral process-force components are minimized.

If the tool exerts a vertical force on the flat substrate, and if this substrate is tilted slightly compared to its setpoint position parallel to the X-Y plane, then the unwanted lateral process-force components thereby occurring are detected by the multicomponent force sensor. This makes it possible to correct the position of the tool such that the lateral process-force components disappear, without the tilting of the substrate being known in advance. Since the tool position is not corrected until the tool has contacted the substrate, the correction may be carried out such that the tool tip (and with it, e.g., the component to be placed) retains the position on the substrate. Instead, the axis of the tool is inclined corresponding to the tilting of the substrate, so that the substrate and tool are again perpendicular to each other. This inclination of the tool may be made possible by a joint between the tool and the positioning device, the joint transferring forces in all directions, but no torque whatsoever. For example, a ball-and-socket joint is well-suited for this purpose, having low friction due to an air cushioning, for instance.

The positioning device itself is able to position the tool in many different manners. In addition to robot arms having several degrees of freedom or multiaxis machine tools, primarily positioning devices in gantry-type construction are possible for the practical applications indicated above, and are described in greater detail below.

Further advantages and details of example embodiments of the present invention are described in more detail below with reference to the Figures.

DETAILED DESCRIPTION

Figure 1:
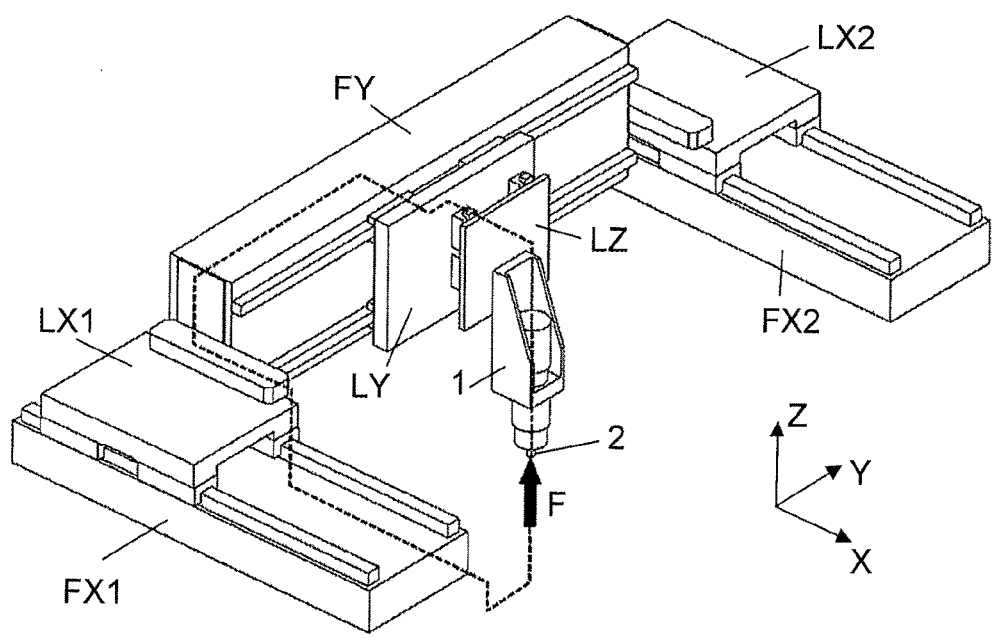
FIG. 1 shows a conventional positioning device in gantry-type construction.

FIG. 1 shows a conventional positioning device in gantry-type construction. Two linear guides FX1, FX2 having integrated linear drives lie parallel to each other in an X direction and support two X-carriages LX1, LX2 in a manner allowing movement in the X-direction. Secured to the two carriages LX1, LX2 is a linear guide which forms cross bar FY of the gantry frame of the positioning device. This cross bar FY may be positioned in the X-direction over the working area between the two linear guides FX1 and FX2.

A Y-carriage LY is supported movably on linear guide FY and is able to be positioned in the Y-direction between the two linear guides FX1 and FX2 by a further linear drive. By suitable control of the drives in linear guides FX1, FX2 and FY, Y-carriage LY is able to be positioned freely over the working area between the two linear guides FX1 and FX2.

Y-carriage LY bears a further linear guide with integrated drive, that supports a Z-carriage LZ in a manner allowing movement in the Z-direction, which is perpendicular to the processing plane defined by the X-direction and Y-direction.

Thus, a toolholder 1 mounted on Z-carriage LZ, and a tool 2 retained by it, is able to be positioned in all three spatial directions X, Y and Z. For example, tool 2 may be a gripper which picks up an electronic component and sets it on a printed circuit board placed in the working area. The force F necessary for this purpose is applied by the drive of Z-carriage LZ. Since Z-carriage LZ is offset laterally on cross bar FY in the X-direction, this vertical force F in the Z-direction gives rise to a torque on cross bar FY. The force loop, which stresses the components of the positioning device upon placement of tool 2 on the workpiece disposed in the X-Y plane, is indicated with a dashed line in FIG. 1.

For the thermocompression bonding mentioned above, tool 2 also includes a heating element with which the electronic component is able to be heated to a temperature above 250° C. within a few seconds, in order to melt the solder used.

Figure 2:
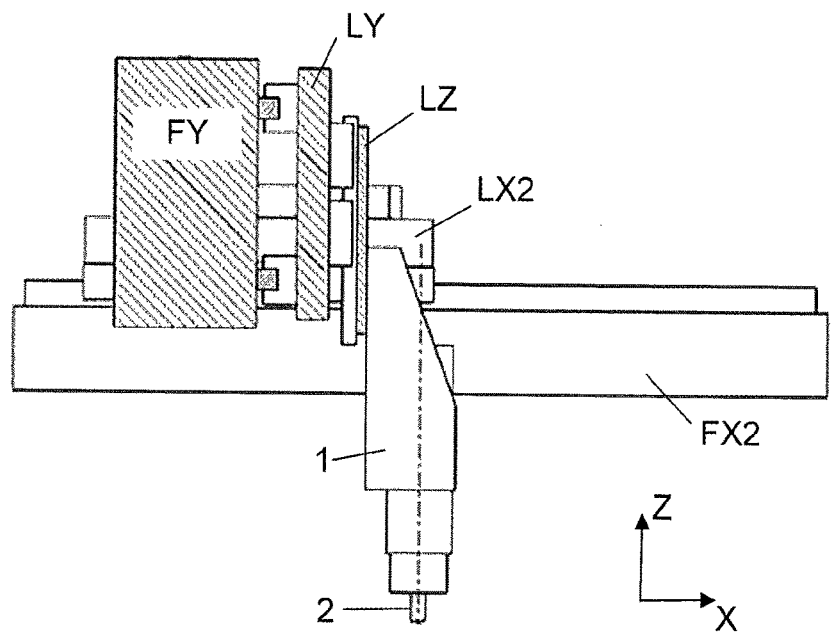
FIG. 2 shows the positioning device of FIG. 1 in a side view.

FIG. 2 shows a section through the positioning device of FIG. 1. The cross-sectional plane lies in the X-Z plane and extends through Z-carriage LZ.

Figure 3:
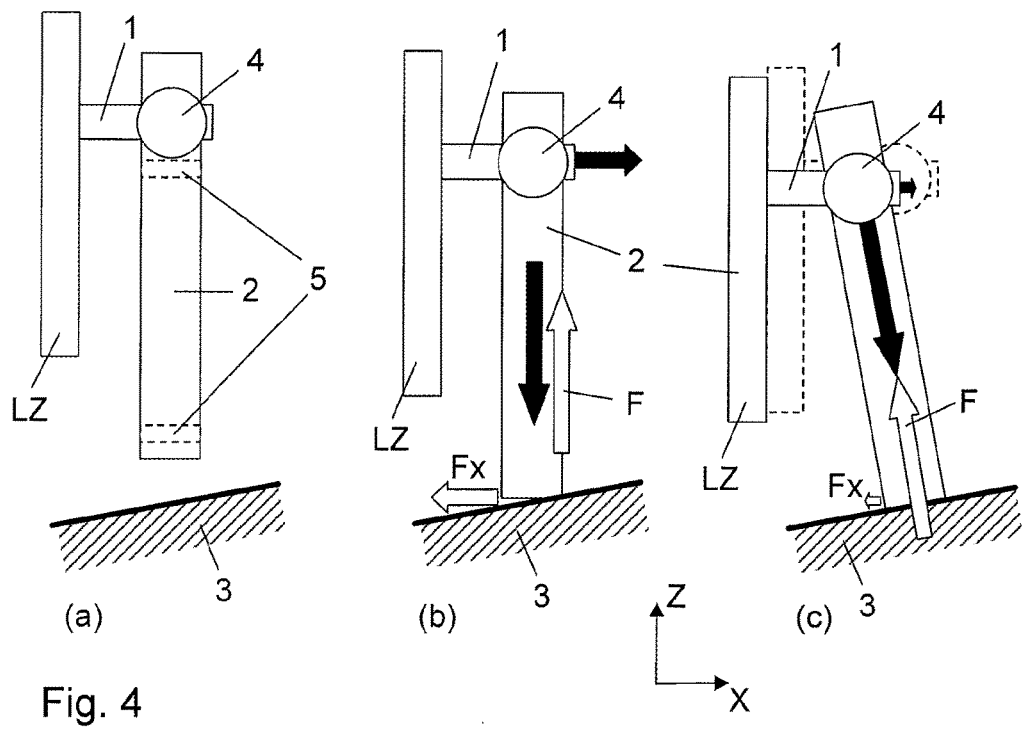
FIG. 3 shows a tool upon placement on a substrate.

FIG. 3 shows in detail, the placement of tool 2 on a substrate 3, which lies in the X-Y plane, but at the same time is slightly tilted about the Y-direction. The tilting is exaggerated in FIG. 3. The tilting should lie at the most in the area of, for example, 0.01 degree. However, even such small angles may lead to disturbing lateral forces.

In Sub-FIG. 3(a), tool 2 is placed above the desired contact point in the X-and Y-direction (to setpoint coordinates Xref and Yref), before the tool is lowered in its axial direction (the Z-direction) onto substrate 3.

In Sub-FIG. 3(b), tool 2 has contacted substrate 3 and is beginning to exert a force F on substrate 3. Because of the tilting of substrate 3, the force applied by the positioning device (black arrow in the axial direction) is offset relative to counterforce F (light arrow in the axial direction) emanating from the substrate. Lateral forces Fx (black and light arrows in the lateral direction) counteract the torque produced in this manner. These lateral forces are detected by a multicomponent force sensor 5 disposed in tool 2. Preferably, multicomponent force sensor 5 is in the vicinity of the tool tip, thus, for example, near the electronic component to be placed, However, as indicated in Sub-FIG. 3(a), other positions are possible, as well.

Sub-FIG. 3(c) illustrates that after a compensating movement (compare the current position of Z-carriage LZ with the position from Sub-FIG. 3(b) indicated with a dashed line), tool 2 has undergone a tilting which corresponds to the tilting of substrate 3, so that tool 2 is now exactly perpendicular to substrate 3. An electronic component to be placed is therefore again parallel to substrate 3. Process force F and its counterforce lie on one line, and the torque described with respect to Sub-FIG. 3(b) disappears. Correspondingly, lateral forces Fx are also very substantially reduced; they now correspond only to the sine of the tilt angle of substrate 3, multiplied by process force F. These small lateral forces must be applied by the drives of the positioning device.

During the correction of the position of tool 2 to minimize lateral forces Fx, the contact point of tool 2 on substrate 3 must no longer change, since, otherwise, an electronic component, for example, would no longer be placed at the correct location. The frictional force between tool 2 and substrate 3 must therefore be great enough for this purpose. Only thus does tool 2 also tilt in the desired manner. Consequently, in the case of thermocompression bonding, the position is corrected after the placement of the electronic component on substrate 3, but still prior to or in any case during the heating of the component, so that the correction is completed before the solder used liquefies. A liquefied solder would reduce the friction too greatly, and the not yet minimized lateral forces Fx would shift the component on substrate 3.

To correct the position, toolholder 1 must provide tool 2 with the degrees of freedom necessary in order to tilt. This may already be attained by a certain flexibility of toolholder 1. However, it is possible to provide a suitable joint 4 on toolholder 1. This joint 4 should be as low-friction as possible. A ball-and-socket joint with an air cushioning may be suitable for this purpose and allows compensating movements in the X- and Y-direction.

Typical values for the forces in the case of a process force F of 500 N are lateral forces of 5 N without the position correction of tool 2 (corresponding to Sub-FIG. 3(b)), and 0.05 N with such a correction (corresponding to Sub-FIG. 3(c)).

Without limiting the generality, FIG. 3 shows the compensation of a lateral process force Fx in the X-direction. The same holds true for forces in the Y-direction; given corresponding tilting of the substrate, both forces may occur simultaneously and may be minimized by corrections of the tool position in the X- and Y-direction.

Figure 4:
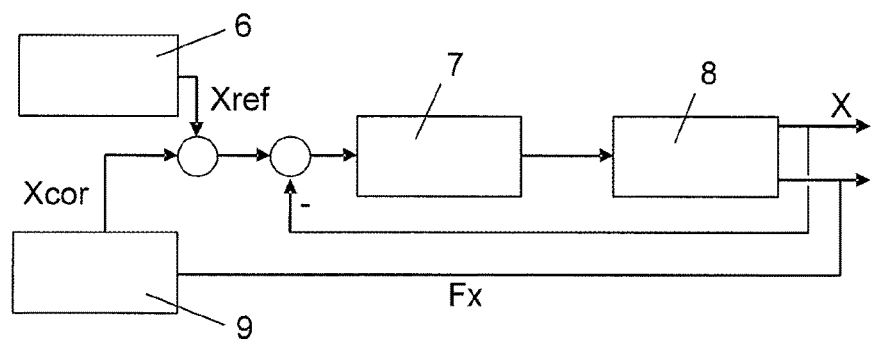
FIG. 4 shows a first closed-loop control structure for minimizing lateral process forces.

FIG. 4 shows a first exemplary embodiment for a closed-loop control circuit, by which lateral forces Fx may be minimized. A primary control 6 specifies a setpoint value Xref with regard to the X-coordinate, which is set in positioning device 8 with the aid of a controller 7 (e.g., a PID controller). At the same time, actual position X is measured, and the deviation from setpoint value Xref is supplied to closed-loop control circuit 7. Unwanted lateral process-force component Fx is likewise measured and supplied to a model 9 of the positioning device, a correction value Xcor being calculated for the position of tool 2 with the aid of model 9. This correction value Xcor is added to setpoint value Xref. In this manner, a compensating movement is impressed in the positioning device, as shown in Sub-FIG. 3(c).

Figure 5:
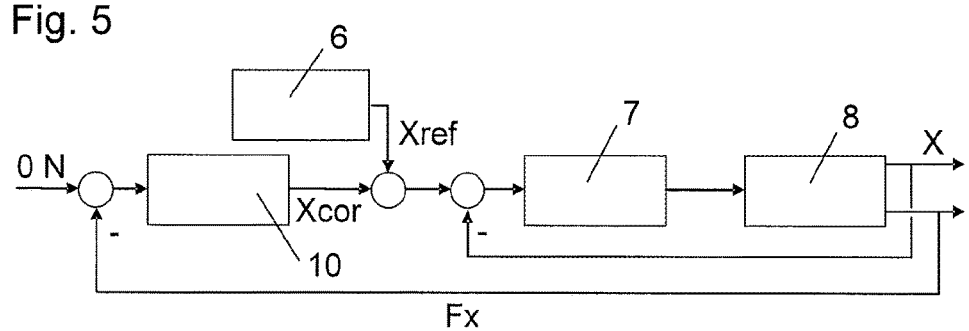
FIG. 5 shows a second closed-loop control structure for minimizing lateral process forces.

FIG. 5 shows a further exemplary embodiment in which correction value Xcor is computed via an additional position-correction controller 10. To that end, a lateral process-force component of 0 N is predefined as setpoint value to position-correction controller 10, and actually measured process-force component Fx is subtracted from this value. Position-correction controller 10, again taking the form of a PID controller, computes correction value Xcor, which in turn is added to setpoint value Xref.

Only a force component in the X-direction is considered in FIGS. 4 and 5; the same holds true for the Y-direction. Example embodiments of the present invention were described above on the basis of the measurement of lateral process-force component Fx. Since this lateral force Fx over a distance from the point of force application to a pivot point (e.g., joint 4) always corresponds to an unwanted torque, as well, the exemplary embodiments of FIGS. 4 and 5 may also be realized by the measurement of a corresponding torque and its use in a model 9 or a position-correction controller 10. This alternative, differing only by the factor of a distance, is intended to be encompassed by the description above.

What is claimed is:

1. A system, comprising:
a positioning device adapted to position a tool at a setpoint position on a flat substrate in an X-Y plane, the tool adapted to exert a process force in an axial direction of the tool perpendicularly onto the substrate;
wherein the tool includes a multicomponent force sensor adapted to measure unwanted process-force components in a lateral direction; and
wherein the positioning device is adapted to correct the setpoint position of the tool such that the lateral process-force components are minimized.

2. The positioning device according to claim 1, wherein the positioning device includes a model adapted to calculate correction values for the setpoint position of the tool in accordance with the measured lateral force components.

3. The positioning device according to claim 1, wherein the positioning device includes a position-correction controller adapted to control the lateral process-force components to zero in accordance with correction values for the setpoint position of the tool being computed by the position-correction controller on the basis of the measured lateral force components.

4. The positioning device according to claim 1, wherein correction of the setpoint position of the tool does not alter the position of the tool on the substrate.

5. The positioning device according to claim 1, wherein the tool is retained by a joint that transfers forces in all directions but no torque.

6. The positioning device according to claim 5, wherein the joint includes an air-cushioned ball-and-socket joint.

7. The positioning device according to claim 1, wherein the positioning device is arranged as a gantry construction, having two parallel linear guides with integrated linear drives, each of which supports an X-carriage in a manner allowing movement in a first direction, and having a cross bar that is joined to the two X-carriages and, with an integrated linear drive, retains a Y-carriage in a manner allowing movement in a second direction perpendicular to the first direction, and having a toolholder that is guided on the Y-carriage in a direction perpendicular to the first direction and to the second direction and that bears the tool for processing the substrate arranged in the X-Y plane.

8. The positioning device according to claim 7, wherein the tool is retained by a joint that transfers forces in all directions but no torque.

9. The positioning device according to claim 8, wherein the joint includes an air-cushioned ball-and-socket joint.

10. A method, comprising:
joining an electronic component to a substrate with the aid of a solder; and
correcting a setpoint position of the tool before the solder liquefies to minimize lateral process forces;
wherein the method is performed using the system recited in claim 1.

* * * * *